United States Patent
Wong

Patent Number: 6,157,558
Date of Patent: Dec. 5, 2000

[54] CONTENT ADDRESSABLE MEMORY CELL AND ARRAY ARCHITECTURES HAVING LOW TRANSISTOR COUNTS

[75] Inventor: Sau-Ching Wong, Hillsborough, Calif.

[73] Assignee: SanDisk Corporation, Campbell, Calif.

[21] Appl. No.: 09/316,499

[22] Filed: May 21, 1999

[51] Int. Cl.$^7$ ............................................. G11C 15/00
[52] U.S. Cl. ............................................................... 365/49
[58] Field of Search ............................ 365/49, 154, 156

[56] References Cited

U.S. PATENT DOCUMENTS

| | | | |
|---|---|---|---|
| 4,538,243 | 8/1985 | Zehner | 365/49 |
| 4,833,643 | 5/1989 | Hori | 365/49 |
| 4,890,260 | 12/1989 | Chuang et al. | 365/49 |
| 4,928,260 | 5/1990 | Chuang et al. | 365/49 |
| 5,034,919 | 7/1991 | Sasai et al. | 365/49 |
| 5,040,134 | 8/1991 | Park | 365/602 |
| 5,051,949 | 9/1991 | Young | 365/49 |
| 5,111,427 | 5/1992 | Kobayashi et al. | 365/49 |
| 5,226,005 | 7/1993 | Lee et al. | 365/49 |
| 5,258,946 | 11/1993 | Graf | 365/49 |
| 5,267,213 | 11/1993 | Sung et al. | 365/226 |
| 5,305,262 | 4/1994 | Yoneda | 365/189.05 |
| 5,383,146 | 1/1995 | Threewitt | 365/49 |
| 5,386,379 | 1/1995 | Ali-Yahia et al. | 365/49 |
| 5,396,449 | 3/1995 | Atallah et al. | 365/49 |
| 5,422,838 | 6/1995 | Lin | 365/49 |
| 5,455,784 | 10/1995 | Yamada | 365/49 |
| 5,568,415 | 10/1996 | McLellan et al. | 365/49 |
| 5,619,446 | 4/1997 | Yoneda et al. | 365/49 |
| 5,642,114 | 6/1997 | Komoto et al. | 341/67 |
| 5,787,458 | 7/1998 | Miwa | 711/108 |
| 5,828,593 | 10/1998 | Schultz et al. | 365/49 |
| 5,859,791 | 1/1999 | Schulz et al. | 365/49 |
| 5,890,201 | 3/1999 | McLellan et al. | 711/108 |
| 5,940,852 | 8/1999 | Rangasayee et al. | 365/49 |
| 5,949,696 | 9/1999 | Threewitt | 365/49 |

OTHER PUBLICATIONS

Aragaki et al., "A High Density Multiple–Valued Content–Addressable Memory Based on One Transistor Cell," *IEICE Trans. Electron.*, vol. E76–C, No. 11, Nov. 1993, pp. 1649–1656.

Ghose and Dharmaraj, "Response Pipelined CAM Chips: The First Generation and Beyond," *The 7th Int'l Conference on VLSI Design*, Jan. 5–8, 1994, pp. 365–368.

Glaise and Munier, "A Low Cost Searching Device for an ATM Adapter," *The 6th Int'l Conference on Computer Communications and Networks*, Sep. 22–25, 1997, pp. 488–493.

Hanyu et al., "Design of a One–Transistor–Cell Multiple–Valued CAM," *IEEE Journal of Solid–State Circuits*, vol. 31, No. 11, Nov. 1996, pp. 1669–1674.

(List continued on next page.)

*Primary Examiner*—Trong Phan
*Attorney, Agent, or Firm*—Majestic, Parsons, Siebert & Hsue

[57] ABSTRACT

An SRAM-based CAM cell and CAM array architecture reduce transistor count and memory size by replacing pass transistors and search transistors of conventional SRAM-base CAM cells with a pair of transistors having gates coupled to bit lines. The two bit-line-controlled transistors in a CAM cell are between storage nodes and a word/match line for the CAM cell. The sizes of pull-up and pull-down devices in the CAM cells are selected so that grounding a storage node to a word/match line through one of the two bit-line-controlled transistors can change the bit stored in a CAM cell, but applying a voltage (near the supply voltage) from the word/match line through either of the two bit-line-controlled transistors to a storage node cannot change the bit or data stored in a CAM cell. Accordingly, a write operation grounds a selected word/match line and applies a voltage to the unselected word/match lines. A search operation charges all word/match lines and senses the word/match lines. Addition of a mask element that controls the connection of the CAM cell to the word/match line can convert a binary CAM architecture to a ternary CAM architecture. The mask element optionally includes circuitry that causes the mask element to power up in a known state. Within the ternary CAM cell, a bypass transistor can be provide to bypass the effect of the mask element and facilitate write operations or temporarily suspend local masking.

35 Claims, 8 Drawing Sheets

OTHER PUBLICATIONS

Hanyu et al., "2–Transistor–Cell 4–Valued Universal–Literal CAM for a Cellular Logic Image Processor," *1977 IEEE Int'l Solid–State Circuits Conference, Digest of Technical Papers*, First Edition, Feb. 1997, pp. 46–47 and 427.

Hanyu et al., "One–Transistor–Cell 4–Valued Universal–Literal CAM for Cellular Logic Image Processing," The 27th Int'l Symposium on Multiple–Valued Logic, May 28–30, 1997, pp. 175–180.

Hanyu et al., "Multiple–Valued Floating–Gate–MOS Pass Logic and Its Application to Logic–in–Memory VLSI," The 28th IEEE Int'l Symposium on Multiple–Valued Logic, May 27–29, 1998, pp. 270–275.

Jamil, "RAM versus CAM," *IEEE Potentials*, vol. 16, No. 2, Apr./May 1997, pp. 26–29.

Kramer et al., "55GCPS CAM Using 5b Analog Flash," *1977 IEEE Int'l Solid–State Circuits Conference, Digest of Technical Papers*, First Edition, Feb. 1997, pp. 44–45 and 427.

Miwa et al., "A 1Mb 2–Transistor/bit Non–Volatile CAM Based on Flash–Memory Technologies," *1996 IEEE Int'l Solid–State Circuits Conference, Digest of Technical Papers*, First Edition, Feb. 1996, pp. 40–41 and 414.

Miwa et al., "A 1–Mb 2–Tr/b Nonvolatile CAM Based on Flash Memory Technologies," *IEEE Journal of Solid–State Circuits*, vol. 31, No. 11, Nov. 1996, pp. 1601–1609.

Shultz and Gulak, "CAM–Based Single–Chip Shared Buffer ATM Switch," IEEE Int'l Conference on Communications, May 1–5, 1994, pp. 1190–1195.

Schultz and Gulak, "Fully–Parallel Multi–Megabit Integrated CAM/RAM Design," IEEE Int'l Workshop on Memory Technology, Design and Testing, Aug. 8–9, 1994, pp. 46–51.

Schultz and Gulak, "Fully Parallel Integrated CAM/RAM Using Preclassification to Enable Large Capacities," *IEEE Journal of Solid–State Circuits*, vol. 31, No. 5, May 1996, pp. 689–699.

Shafai et al., "Fully Parallel 30–MHz, 2.5–Mb CAM," *IEEE Journal of Solid–State Circuits*, vol. 33, No. 11, Nov. 1998 pp. 1690–1696.

Wade and Sodini, "A Ternary Content Addressable Search Engine," *IEEE Journal of Solid–State Circuits*, vol. 24, No. 4, Aug. 1989, pp. 1003–1013.

Yamagata et al., "A 288–kb Fully Parallel Content Addressable Memory Using a Stacked–Capacitor Cell Structure," *IEEE Journal of Solid–State Circuits*, vol. 27, No. 12, Dec. 1992, pp. 1927–1933.

Yamagata et al., "A Bitline Control Circuit Scheme and Redundancy Technique for High–Density Dynamic Content Addressable Memories," *IEICE Trans. Electron.*, vol. E76–C, No. 11, Nov. 1993, pp. 1657–1664.

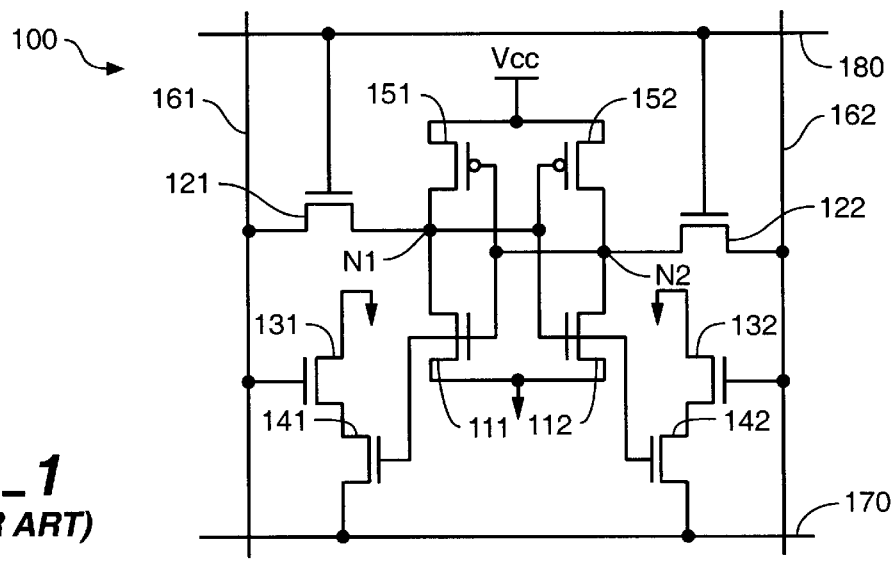
FIG._1
(PRIOR ART)
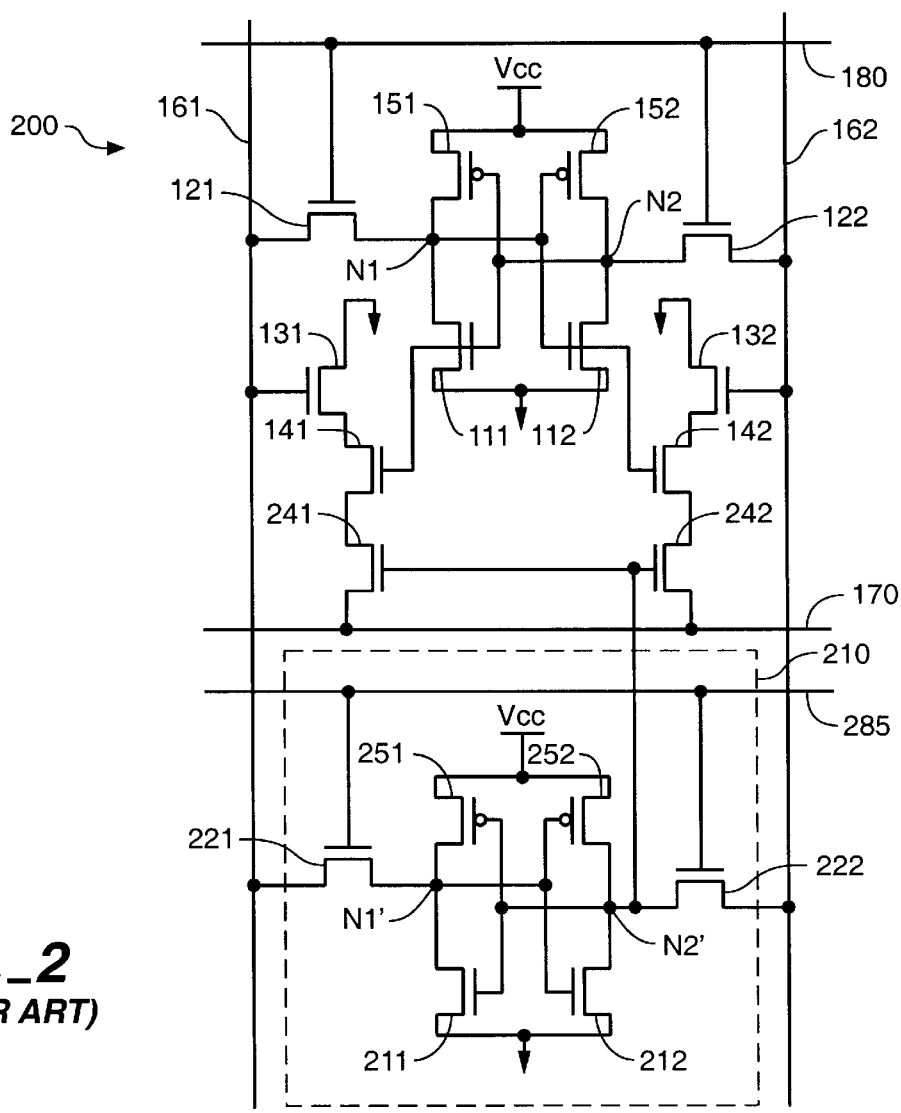
FIG._2
(PRIOR ART)

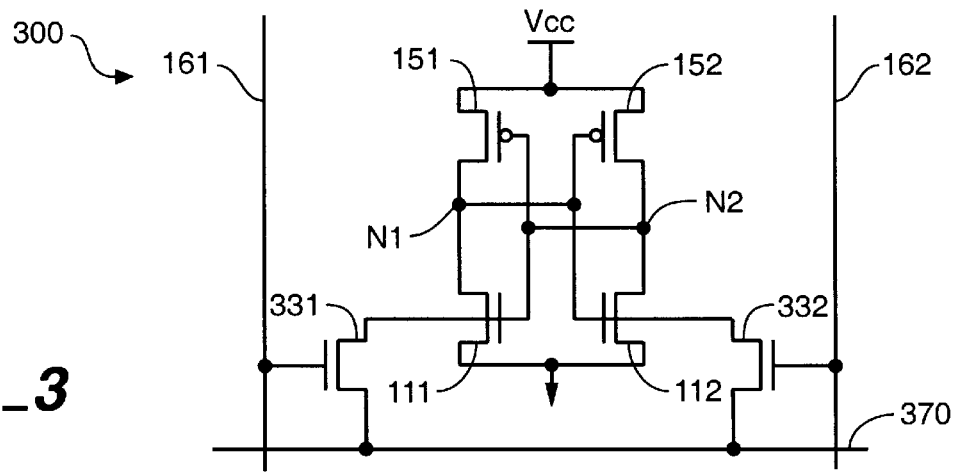
FIG._3
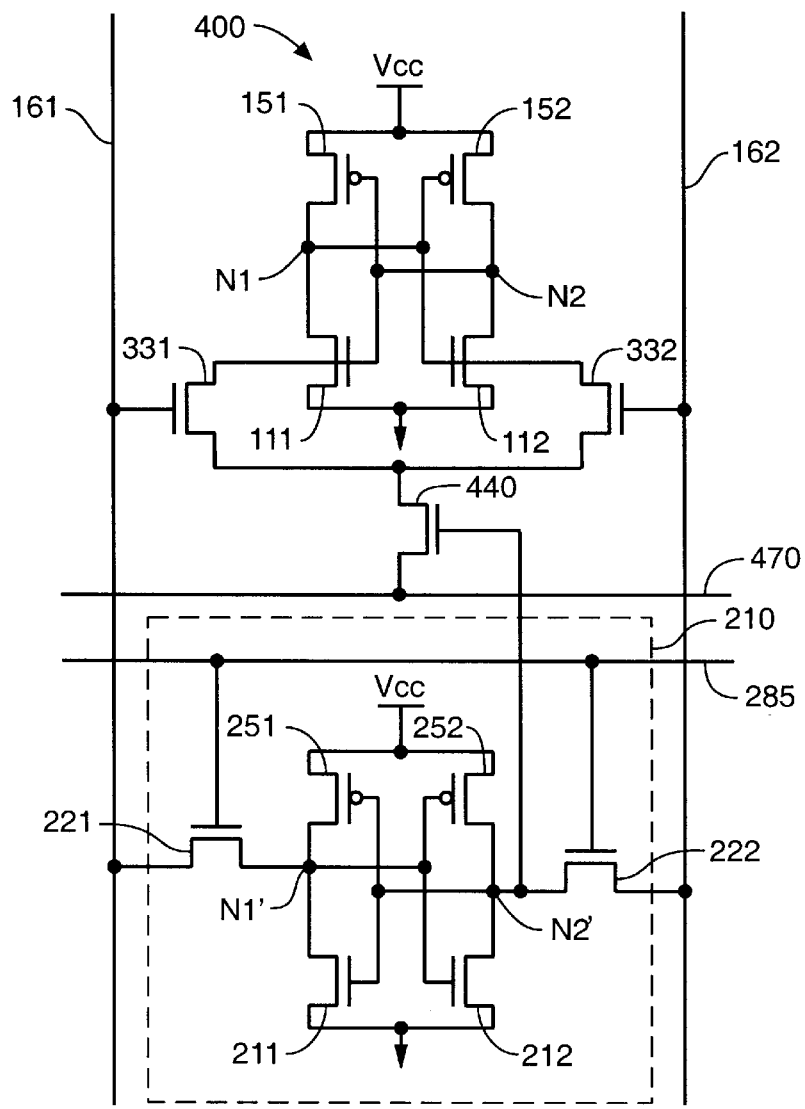
FIG._4A

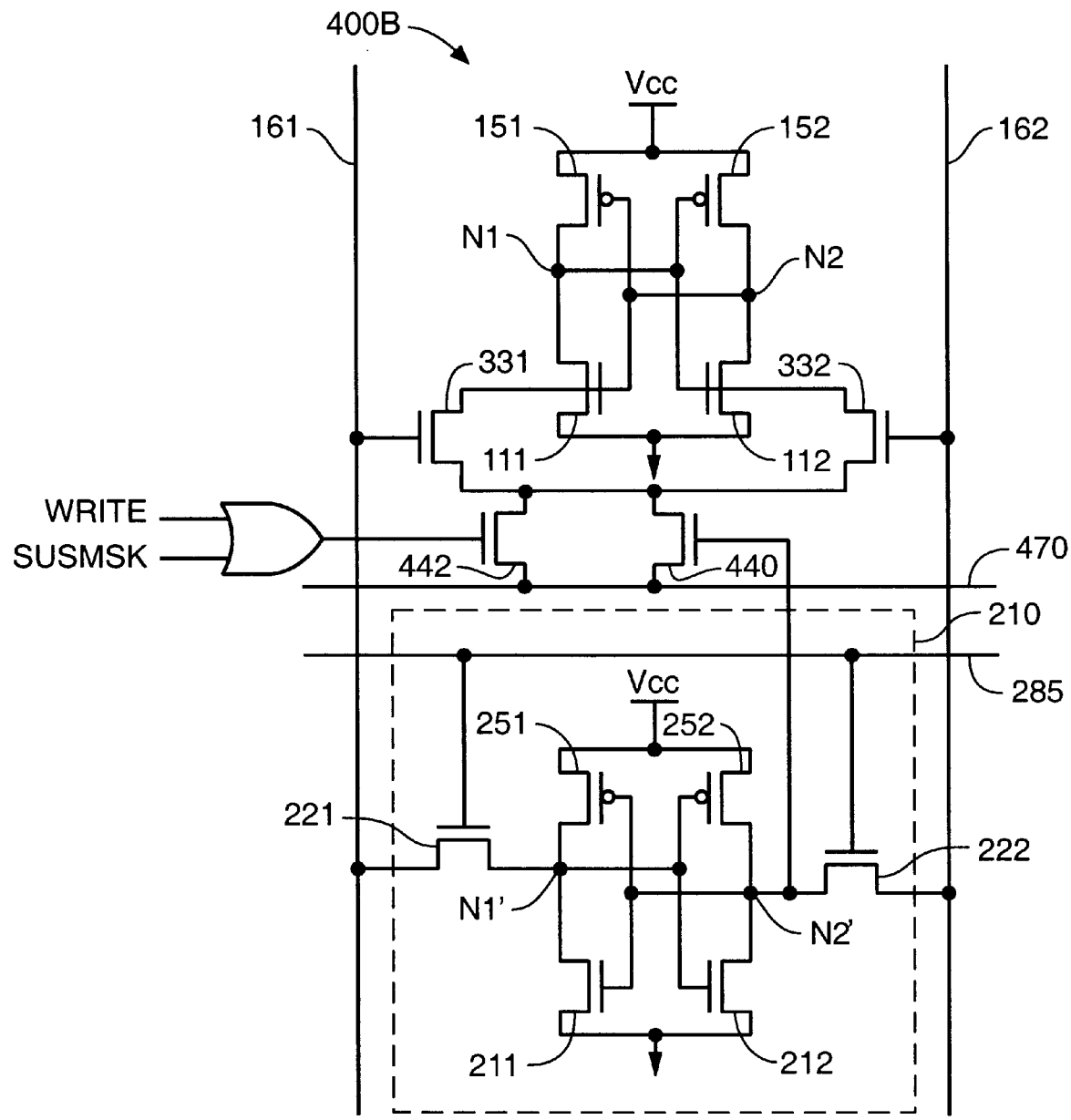
FIG._4B

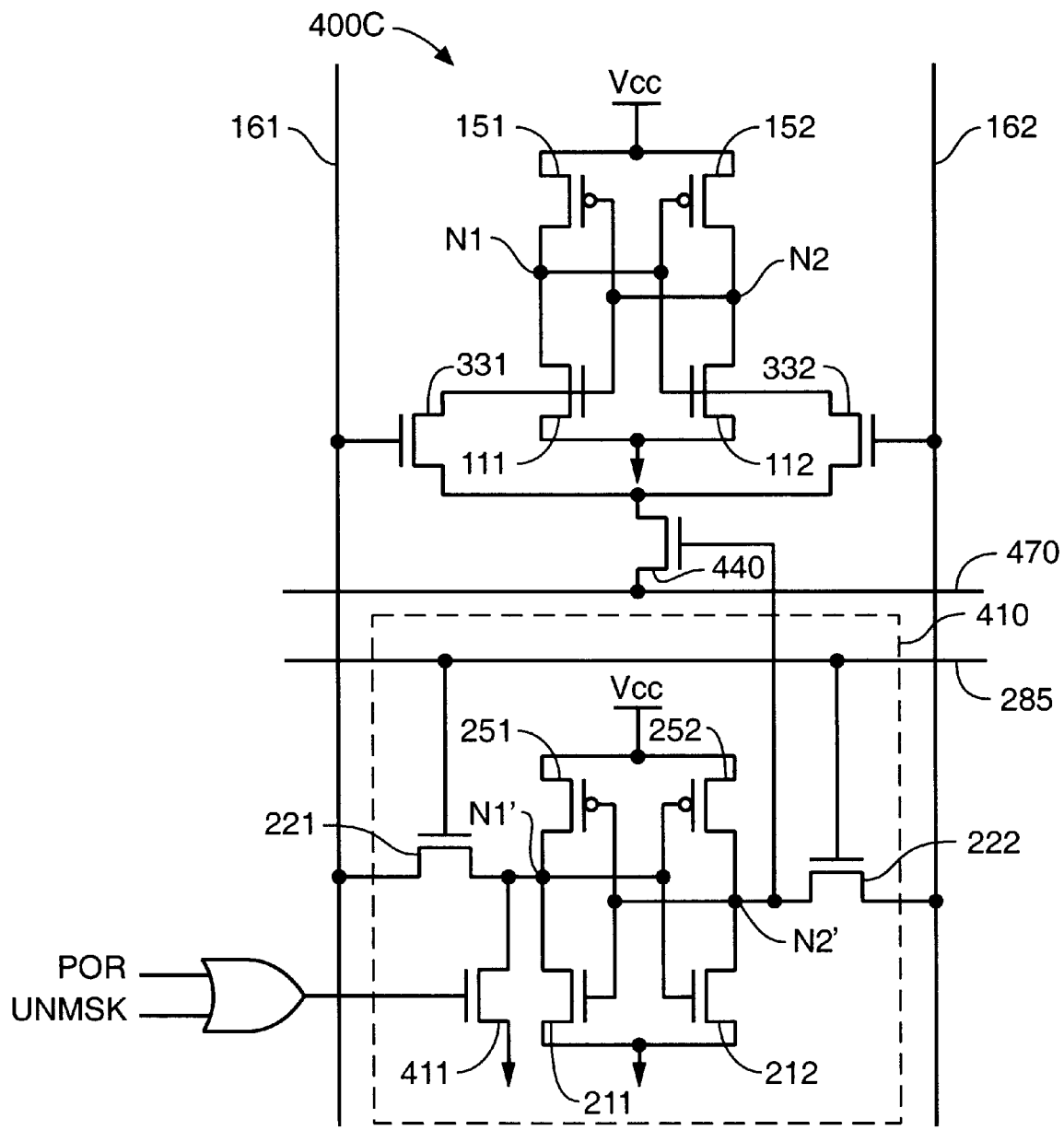
FIG._4C

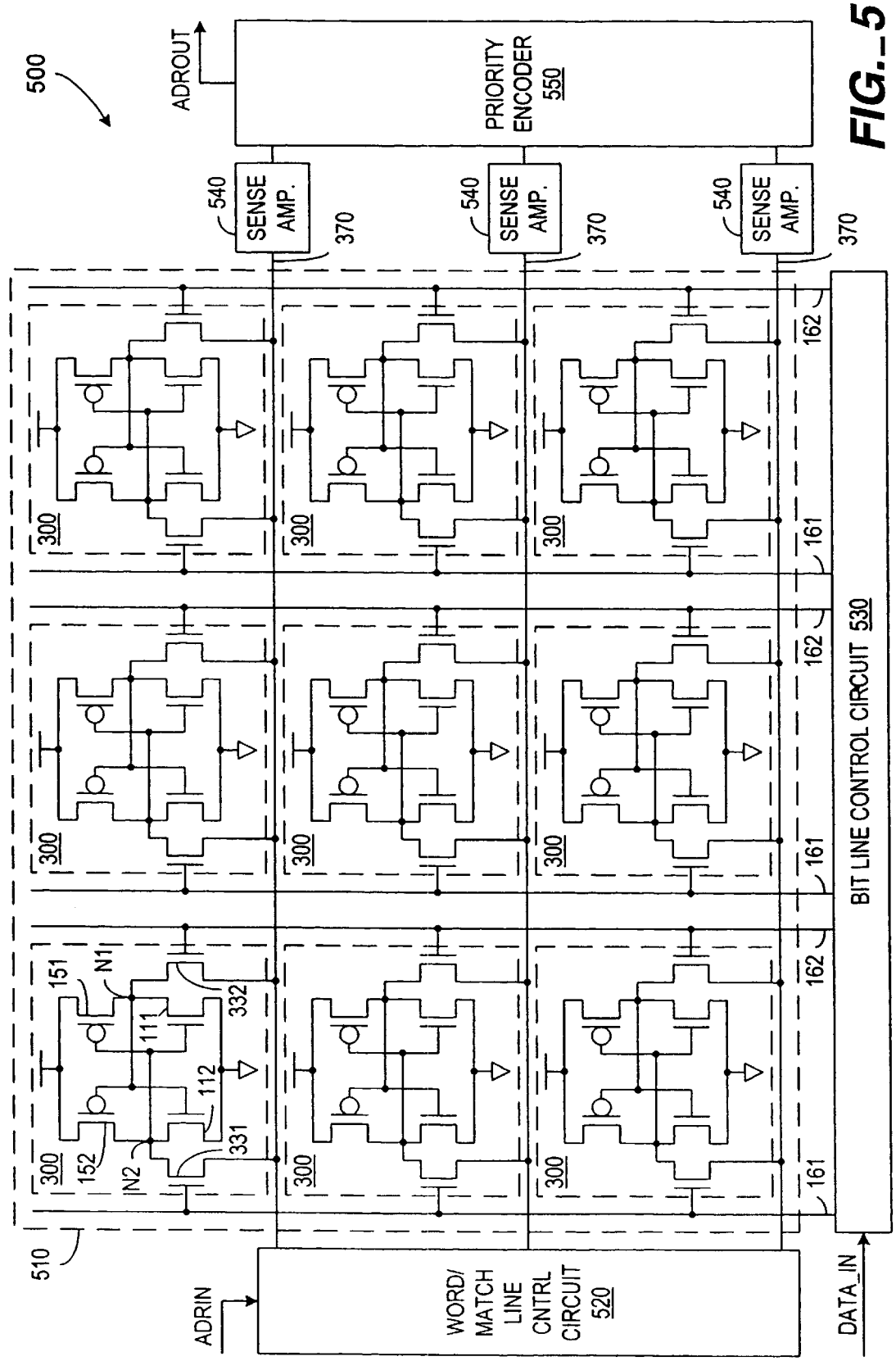

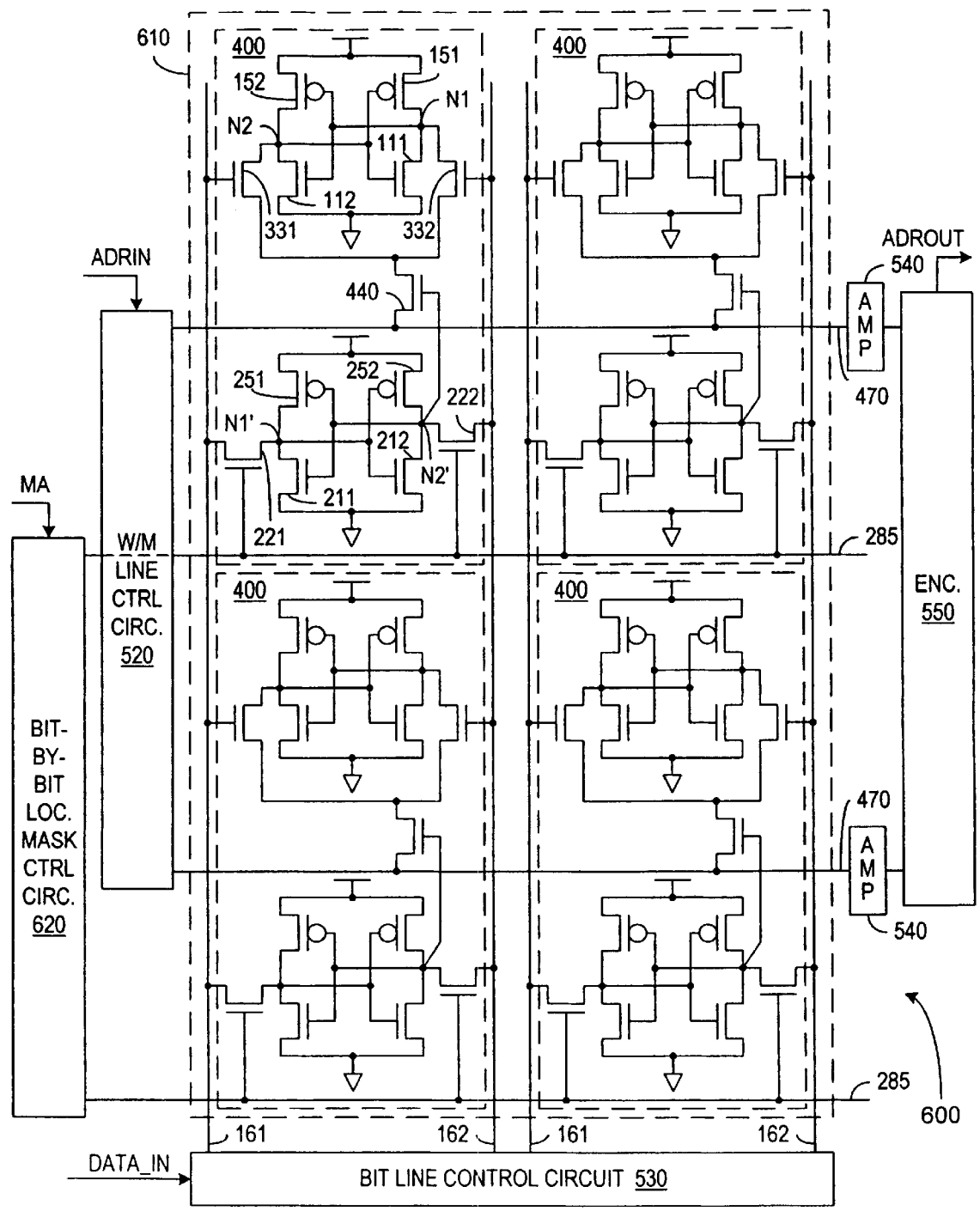
FIG._6

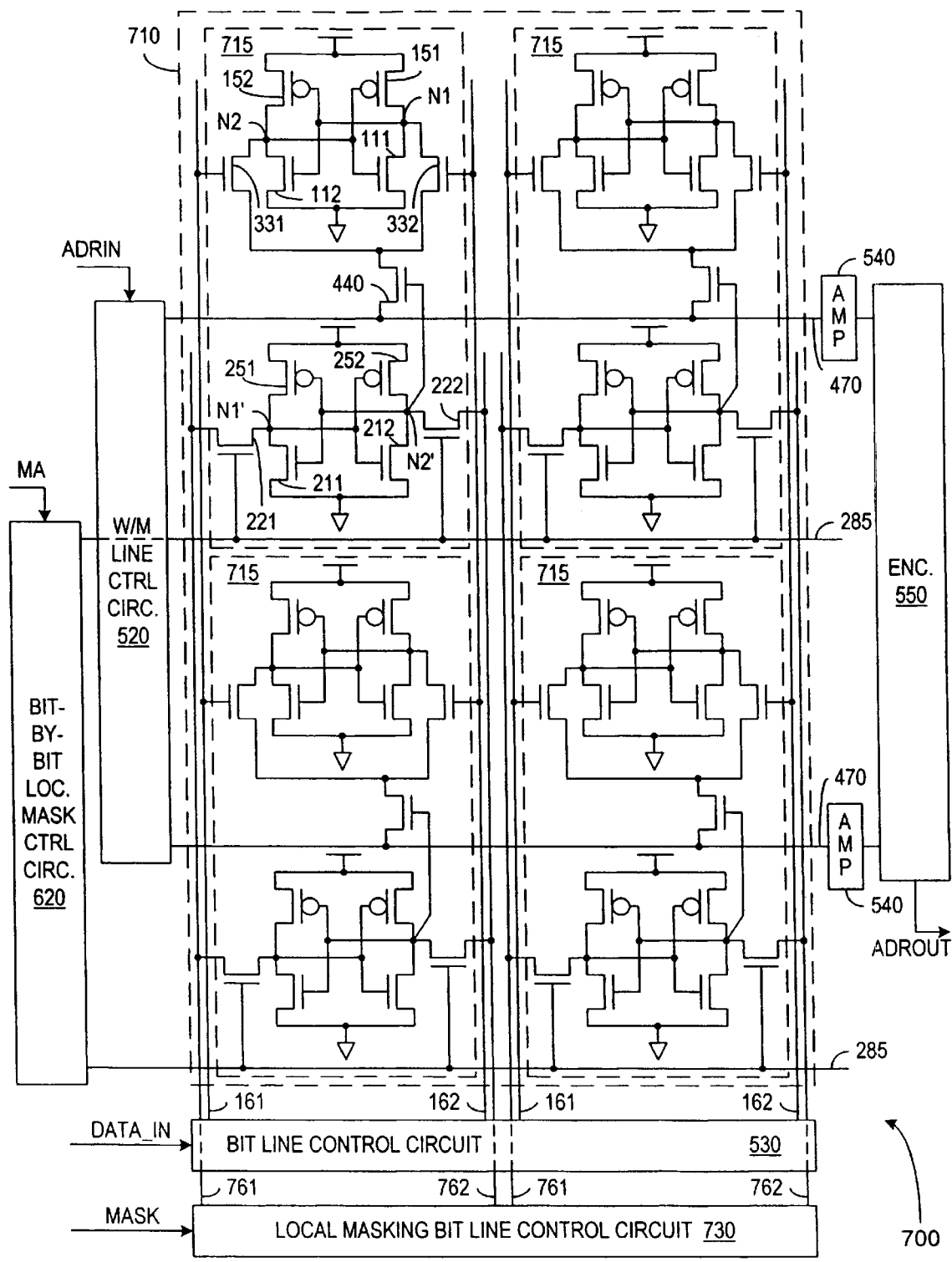
FIG._7

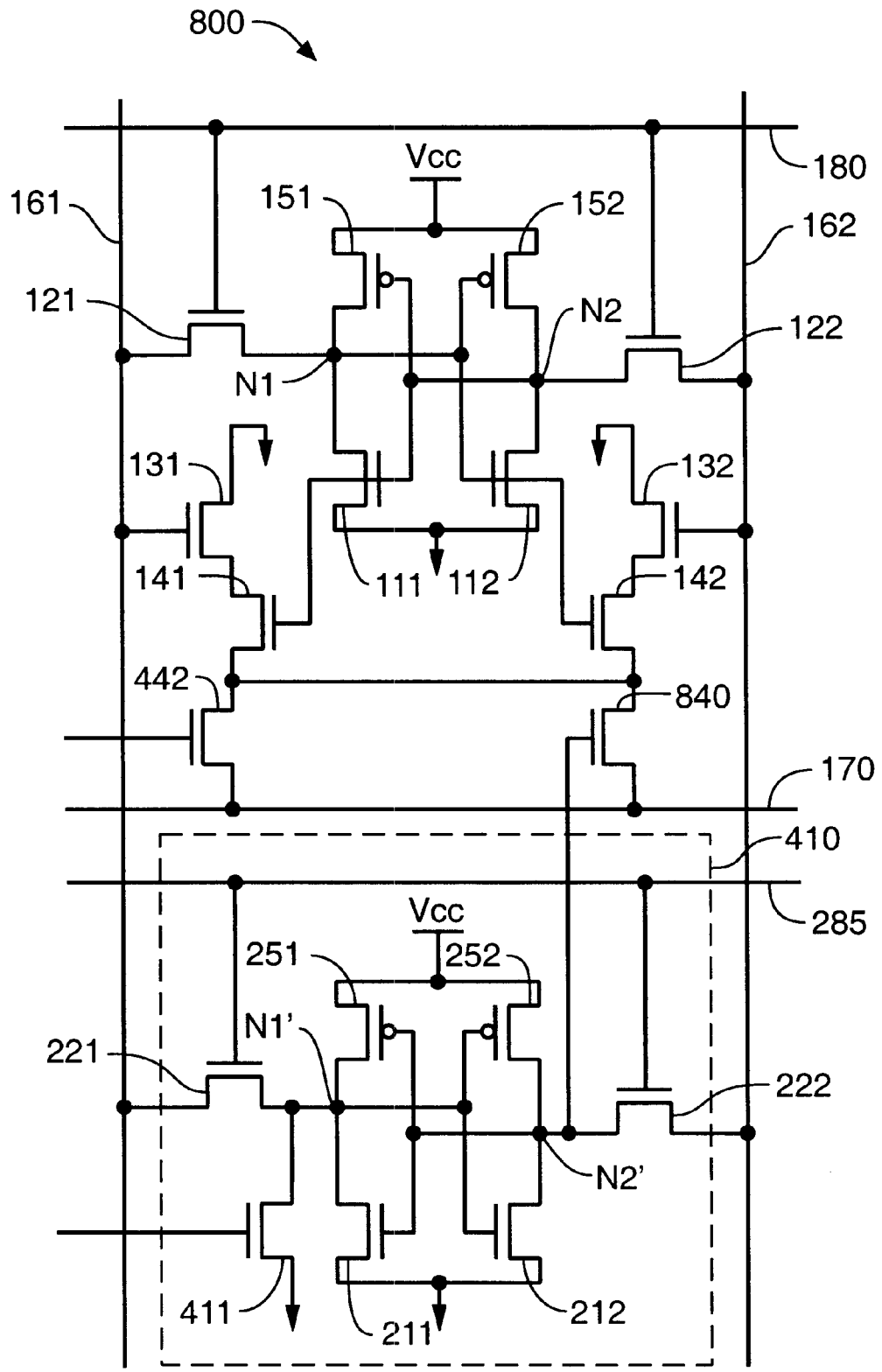
FIG._8

CONTENT ADDRESSABLE MEMORY CELL AND ARRAY ARCHITECTURES HAVING LOW TRANSISTOR COUNTS

BACKGROUND

1. Field of the Invention

This invention relates to content addressable memory having SRAM based data storage.

2. Description of Related Art

A content addressable memory (CAM) can store a large amount of data for simultaneous comparisons with input values. The conventional CAM includes an array of CAM cells where each row of the CAM array corresponds to a stored word. The CAM cells in a row couple to a word line and a match line associated with the row. The word line connects to a control circuit that can select the row for a write operation or bias the word line for a search. The match line carries a signal that during a search, indicates whether the word stored in the row matches an input value. Each column of the conventional CAM array corresponds to the same bit position in all of the words, and the CAM cells in a column couple to a pair of bit lines associated with the column. A search applies to each pair of bit lines, a pair of complementary binary signals that represent a bit of an input value. Each CAM cell changes the voltage on the associated match line if the CAM cell stores a bit that does not match the bit represented on the attached bit lines. Accordingly, if the voltage on a match line remains unchanged during a search, the word stored in that row of CAM cells is equal to the input value.

Known binary and ternary CAM cells are based on SRAM, DRAM, or non-volatile memory circuits. SRAM-based CAM cells have several desirable features. For example, SRAM-base CAMs are relatively fast for write and search operations, and do not require the refresh circuitry that DRAM-base CAM cells have. However, the known SRAM-based CAM cells have a high transistor count and accordingly require a relatively large integrated circuit which increases manufacturing costs.

FIG. 1 shows a conventional, SRAM-based, binary CAM cell 100. Binary CAM cell 100 is a 10-transistor CMOS device including eight N-channel transistors 111, 112, 121, 122, 131, 132, 141, and 142 and two P-channel transistors 151 and 152. Transistors 111, 112, 121, 122, 151, and 152 form a standard six-transistor (6-T) SRAM cell. In particular, P-channel transistor 151 and N-channel transistor 111 connect in series between a supply voltage Vcc and ground and have gates coupled to a node N2 between transistors 112 and 152. P-channel transistor 152 and N-channel transistor 112 also connect in series between a supply voltage Vcc and ground but have gates coupled to a node N1 between transistors 151 and 111. Transistors 111, 112, 121, and 122 as connected form a bi-stable storage element. Pass transistors 121 and 122 connect respective nodes N1 and N2 to respective bit lines 161 and 162, and a word line 180 couples to the gates of pass transistors 121 and 122.

A conventional write operation that stores a bit in CAM cell 100, raises word line 180 to a voltage that turns on pass transistors 121 and 122 and applies complementary signals to bit lines 161 and 162 respectively. The complementary signals, which indicated the bit to be written, charge nodes N1 and N2 to complementary voltages, e.g., supply voltage Vcc and ground, before the write process ends and lowers the voltage on word line 180 to shut off pass transistors 121 and 122. The node N1 or N2 at the high voltage turns off the opposite P-channel transistor 152 or 151 and turns on the opposite N-channel transistor 112 or 111 to maintain the opposite node N2 or N1 at the low voltage. The node N2 or N1 at the low voltage turns on the opposite P-channel transistor 151 or 152 and turns off the opposite N-channel transistor 111 or 112 to maintain the opposite node N1 or N2 at the high voltage.

For searches, CAM cell 100 includes a match line 170 and search transistors 131, 132, 141, and 142. Transistors 131 and 141 are connected in series between match line 170 and ground with the gate of transistor 131 coupled to bit line 161 and the gate of transistor 141 coupled to node N2. Transistors 132 and 142 are connected in series between match line 170 and ground with the gate of transistor 132 coupled to bit line 162 and the gate of transistor 142 coupled to node N1. During a search, bit lines 161 and 162 are biased with complementary signals indicating a bit of an input value, and match line 170 is charged to a sensing voltage. Typically, the voltage on match line 170 is at or near supply voltage Vcc during a search. The high voltage on bit line 161 or 162 turns on one transistor 131 or 132, but if the input bit matches the bit stored in the SRAM cell, the opposite node N2 or N1 is at the low voltage and shuts off the serially connected transistor 141 or 142. Accordingly, for a match, neither pair of serially connected transistors 131 and 141 nor 132 and 142 pulls down the voltage on match line 170. If the input bit or data does not match the bit or data stored in the SRAM cell, the opposite node N2 or N1 from the conductive transistor 131 or 132 is at a high voltage which also turns on the serially connected transistor 141 or 142. Accordingly, if there is no match, one set of pair of serially connected transistors 131 and 141 or 132 and 142 pulls down the voltage on match line 170. A sense amplifier (not shown) coupled to match line 170 senses whether any CAM cell 100 pulls down match line 170 and generates a match signal indicating whether a CAM word matches the input value.

A ternary CAM cell has three storage states 0, 1, or "don't care." FIG. 2 shows a conventional SRAM-base ternary CAM cell 200. CAM cell 200 includes transistors 111, 112, 121, 122, 131, 132, 141, 142, 151, and 152 which connect to bit lines 161 and 162 and word line 180 as described above in regard to the binary CAM cell 100 of FIG. 1. CAM cell 200 also includes a transistor 241, which is in series with transistors 131 and 141 between match line 170 and ground, and a transistor 242, which is in series with transistors 132 and 142 between match line 170 and ground. A node N2' of an SRAM cell 210 connects to the gates of transistors 241 and 242 and controls whether transistors 241 and 242 are conductive. When SRAM cell 210 stores a zero indicating local masking of CAM cell 200, transistors 241 and 242 are off (not conductive), and CAM cell 200 cannot pull down word line 170 during a search. Accordingly, when SRAM cell 210 stores a zero, CAM cell 200 is in the "don't care" state and never indicates that the bit stored fails to match an input bit. When SRAM cell 210 stores a "one", both transistors 241 and 242 are on, and CAM cell 200 performs a search in the same manner described above for CAM cell 100.

Binary CAM cell 100 includes ten transistors. In addition to the structure of binary CAM cell 100, ternary CAM cell 200 includes an additional word line 285 that connects to gates of pass transistors 221 and 222 to permit writing to SRAM cell 210 and includes eight added transistors 211, 212, 221, 222, 241, 242, 251, and 252. Accordingly, ternary CAM cell 200 as shown in FIG. 2 includes eighteen transistors. For both binary and ternary SRAM-based CAM cells 100 and 200, the high transistor counts make the CAM cells occupy a relatively large area in an integrated circuit. Accordingly, arrays of SRAM-based CAM cells are large which increases the cost per chip for producing SRAM-based CAM. A smaller and simpler CAM cell is sought that retains the advantages of fast operation, low power consumption, and minimal overhead circuitry.

SUMMARY

In accordance with the invention, an SRAM-based CAM cell architecture reduces transistor count and memory size by replacing pass transistors and search transistors of conventional SRAM-base CAM cells with a pair of transistors that have gates coupled to bit lines. The two bit-line-controlled transistors in a CAM cell are between storage nodes in the CAM cell and a combined word/match line for the CAM cell. Complementary signals applied to a pair of bit lines turns on one of the bit-line-control transistors for write and search operations. The pull-up and pull-down devices in the CAM cells have sizes selected so that grounding a storage node to a word/match line through a bit-line-controlled transistor can change the bit stored in a CAM cell for a write operation, but the two bit-line-controlled transistors cannot change the bit stored in a CAM cell when the word/match line is above the node's voltage (e.g., near the supply voltage Vcc). Accordingly, a write operation grounds a selected word/match line and applies a voltage to the unselected word/match lines. A search operation charges all word/match lines to the voltage and senses the word/match lines.

Addition of a mask element that controls the connection of the binary CAM cell to the match/word line converts a binary CAM cell architecture to a ternary CAM cell architecture which provides a "don't care" state. The mask elements can be a convention storage element such as an SRAM cell that couples to the bit lines. A conventional write method changes the state of the mask element, but the word/match lines are high to prevent disturbance of the data stored in CAM cells when bit line voltages change the states of the mask elements.

One embodiment of the invention is a CAM cell that includes a first and second pull-up devices and a first and second pull-down transistors. The second pull-down transistor has a control terminal coupled to a first node between the first pull-up device and the first pull-down transistor. The first pull-down transistor has a control terminal coupled to a second node between the second pull-up device and the second pull-down transistor. A third transistor is between the second node and a word/match line and has a control terminal coupled to a first bit line. A fourth transistor is between the first node and the word/match line and has a control terminal coupled to a second bit line. Typically, the first through fourth transistors are N-channel transistors, and the first and second pull-up devices are P-channel transistors. Further, the third and fourth transistors when in respective conductive states, have greater current capacities than those of the first and second pull-up devices. The first and second pull-down transistors when in respective conductive states, have greater current capacities than those of the third and fourth transistors. According to this embodiment, a binary CAM cell requires only six devices or transistors.

A ternary CAM cell further includes: a fifth transistor through which the third and/or fourth transistors connect to the word/match line; and a mask element coupled to a control terminal of the fifth transistor. The mask element has a first state which makes the fifth transistor non-conductive and a second state which makes the fifth transistor conductive. An optional sixth transistor id in parallel with the first transistor between the word/match line and third and fourth transistors. Control circuitry turns on the sixth transistor to temporality disable masking during a write operation or search operation. Accordingly, the ternary CAM cell has seven or eight devices or transistors plus the devices or transistors in the mask element. When the mask element is a 6-T SRAM cell, a ternary CAM cell includes thirteen or fourteen transistors or five or four fewer than in a known ternary CAM cell.

In accordance with another aspect of the invention, the structure of mask elements can ensure that the mask element powers up in a known state. For example, asymmetry in the sizes or current capacity of transistors in the mask element can ensure that the nodes of a bi-stable storage element power up in a known state. Alternatively, an additional pull-down or pull-up device in the mask element can be activated during power up to pull a node in the mask element to a known state.

A CAM including an array of the CAM cells having any of the cell architectures described herein typically also includes control circuits, sense amplifiers, and an encoder. Control circuits for the array control the word/match line and bit line voltages for write and search operations. In particular, during a write operation, a word/match line control circuit receives an input address signal identifying a selected word/match line and in response, grounds the selected word/match line while biasing unselected word/match lines to near supply voltage Vcc. A bit line control circuit applies complementary signals to pairs of bit lines to represent a value being written. During a search, the word/match lines are charged "high" for sensing, and each sense amplifier senses the state of an associated word/match line of the array during the search. The encoder receives match signals from the sense amplifiers and generates an output signal or address associated with a row of the array storing a CAM word that matches the input value for the search.

During a write operation for an array of ternary CAM cells, the control circuit receives an input address signal identifying a selected word/match line and in response, grounds the selected word/match line and the masking word lines while biasing unselected word/match lines to a supply voltage. Each write operation also includes an initial masking operation that places each mask element associated with the selected word/match line, in a state indicating no masking. During a masking operation, the input address signal to the control circuit identifies a selected masking word line, and in response, the control circuit biases the word/match lines and the selected masking word line to the supply voltage and grounds unselected masking word lines. During a search, the word/match lines are charged for sensing, and the masking word lines are grounded. During write operations, masking operations, and searches, the bit line circuit applies complementary signals to the bit line pair for each column, and the complementary signals indicate a bit being written, a state for the mask element, or a bit for comparison with stored bits.

To simplify operation of the ternary CAM, the mask elements can be designed to power up to a known state, "masking on" or "masking off". One such embodiment uses asymmetric bi-stable storage elements for the masking elements. In an exemplary asymmetric storage element, a first storage node connects to ground through a relatively large pull-down transistors and/or connects to supply voltage Vcc through a relatively small pull-up transistor, and during start-up, the sizes of the transistors in the storage element cause the first node to consistently settle in the low voltage state. Alternatively, each masking element can include an additional N-channel device connected between a first node and ground. A gate of the N-channel device receives a power-on-reset signal that causes the N-channel device to pull the first node to the low voltage state when the CAM is reset.

In accordance, with another embodiment of the invention, a write operation for a content addressable memory such as those described above, includes: applying complementary signals to each pair of bit lines in the array; grounding a selected word/match line; and applying a voltage to word/match lines other than the selected word/match line. Each pair of bit lines carries complementary signals identifying a bit associated with the pair of bit lines. For each CAM cell connected to the selected word/match line, grounding of one of the two storage nodes in the CAM cell through one of the two of transistors controls states of the nodes to write a bit in the CAM cell, but the combination of the complementary signals on the bit lines and word/match lines at the voltage do not change states of the nodes in the CAM cells. A search includes: charging the word/match lines to the voltage; applying complementary signals to each pair of bit lines, each pair of bit lines having applied complementary signals identifying a bit associated with the pair of bit lines; and sensing whether word/match lines' states remain unchanged when applying the complementary signals.

BRIEF DESCRIPTION OF THE DRAWINGS

FIG. 1 is a circuit diagram for a known binary, SRAM-based CAM cell.

FIG. 2 is a circuit diagram for a known ternary, SRAM-based CAM cell.

FIG. 3 is a circuit diagram for a bi nary, SRAM-based CAM cell in accordance with an embodiment of the invention.

FIGS. 4A, 4B, and 4C are circuit diagrams for ternary, SRAM-based CAM cells in accordance with alternative embodiments of the invention.

FIGS. 5 and 6 are CAMs including arrays of the CAM cells of FIGS. 3 and 4A.

FIG. 7 is a ternary CAM including bit lines for masking that are separate from bit lines for search and write operations.

FIG. 8 is a circuit diagram for a ternary CAM cell in accordance with another embodiment of the invention.

Use of the same reference symbols in different figures indicates similar or identical items.

DETAILED DESCRIPTION

In accordance with an aspect of the invention, a transistor having a gate connected to a bit line replaces a pass transistor for writing to a CAM cell and replaces search transistors that are serially connected to change the state of a match line if there is no match during a search. These replacements permit removal of four transistors and a word line from an SRAM-based CAM cell and therefore provides a smaller and simpler CAM cell that can be less expensively integrated into an SRAM-based CAM.

FIG. 3 shows an SRAM-based, binary CAM cell 300 in accordance with an embodiment of the invention. Binary CAM cell 300 is a six-transistor CMOS CAM cell including four N-channel field effect transistors 111, 112, 331, and 332 and two P-channel transistors 151 and 152. For a storage element in CAM cell 300, P-channel field effect transistor 151 and N-channel transistor 111 connect in series between a supply voltage Vcc and ground and have gates coupled to a node N2 between transistors 112 and 152. P-channel transistor 152 and N-channel transistor 112 also connect in series between supply voltage Vcc and ground but have gates coupled to a node N1 between transistors 151 and 111. CAM cell 300 does not have pass transistors or separate word and match lines. Instead, CAM cell 300 includes N-channel transistors 331 and 332 which connect a word/match line 370 to respective nodes N2 and N1. The gates of transistors 331 and 332 connect to bit lines 161 and 162 respectively.

A write operation, which stores a bit in CAM cell 300, applies complementary write signals to bit lines 161 and 162 to indicate the bit being written and grounds word/match line 370. The complementary write signals apply a voltage (e.g., supply voltage Vcc) to one bit line 161 or 162 and ground the other bit line 162 or 161. The voltage on bit line 161 or 162 turns on one transistor 331 or 332 so that the transistor 331 or 332 conducts. Grounding the other bit line 162 or 161 keeps the other transistor 332 or 331 off. The dimensions and charge mobility of transistors 331 and 332 are such that the saturation current through N-channel transistors 331 and 332 is greater than the saturation current through P-channel transistors 151 and 152. Accordingly, during a write, the conductive one of transistors 331 and 332 discharges the attached node N2 or N1 to the grounded word/match line 370. The node N2 or N1 being grounded turns on the opposite P-channel transistor 151 or 152 and turns off the opposite N-channel transistor 111 or 112 to pull the opposite node N1 or N2 up to supply voltage Vcc. The opposite node N1 or N2 being at the high voltage turns off P-channel transistor 152 or 151 and turns on N-channel transistor 112 or 111 to help pull down the first node N2 or N1 at the end of the write operation. At the end of the write operation, bit lines 161 and 162 are grounded before bringing word/match line 370 to a voltage near supply voltage Vcc. This allows transistors 111, 112, 151, and 152 to maintain the voltages on nodes N1 and N2, which represent the stored data bit. These biasing conditions prevail during standby or idle periods during which neither a search nor a write operation is taking place.

For illustration, the following description presumes that writing a one to CAM cell 300 places CAM cell 300 in a state where node N1 is nearly at supply voltage Vcc and node N2 is nearly at the ground potential. Correspondingly, writing a zero in CAM cell 300 places CAM cell 300 in a state where node N1 nearly at the ground potential and node N2 is nearly at supply voltage Vcc. Table 1 indicates the voltages applied to CAM cell for write operation using the presumed storage convention.

TABLE 1

| CAM Cell Voltages during a Write | | | | |
|---|---|---|---|---|
| Bit to Store | BL 161 Voltage | BL 162 Voltage | Resulting N1 State | Resulting N2 State |
| 0 | 0 | Vcc | 0 | Vcc |
| 1 | Vcc | 0 | Vcc | 0 |

An opposite storage convention could also be employed resulting in obvious changes to Table 1.

A search operation also biases bit lines 161 and 162 with complementary signals indicating a bit of an input value, but a search charges word/match line 370 to a voltage near supply voltage Vcc, instead of grounding word/match line 370 as in a write operation. The complementary signals include a high signal at a voltage (e.g., at or near supply voltage Vcc) on one bit line 161 or 162 and a low signal (e.g., at or near ground) on the other bit line 162 or 161. If the node N2 or N1 at supply voltage Vcc is connected to the transistor 331 or 332 having a gate receiving the "high" signal voltage, neither transistor 331 or 332 conducts because one transistor 331 or 332 has its gate, source, and drain at or near the same voltage (e.g., voltage Vcc) and the other transistor 332 or 331 has its gate grounded. If the grounded node N2 or N1 connected to the transistor 331 or 332 having a gate (i.e., bit line) receiving the "high" signal voltage, the higher search signal voltage on the bit line causes the transistor 331 or 332 to conduct current from word/match line 370 to the grounded node N2 or N1. To prevent this current from changing the stored value (i.e., the voltage states of nodes N1 and N2), pull-down transistors 111 and 112 are sized to have a higher saturation current than do transistors 331 and 332. As a result, the intermediate voltage level developed at node N1 or N2 due to the current flowing through transistor 331 or 332 and 112 or 111 is insufficient to flip the bi-stable storage element to an opposite state and change the stored data.

In one exemplary embodiment of CAM cell, each transistor 111, 112, 151, 152, 331 and 332 has the minimum device size. For example, for a 0.5-$\mu$m process, each transistor can have a channel length and width of about 0.5 $\mu$m and about 0.7 $\mu$m, respectively. For a 0.18-$\mu$m process, each transistor can have a channel length and width of about 0.18 $\mu$m and about 0.25 $\mu$m, respectively. When P-channel transistors 151 or 152 have the same dimensions as N-channel transistors 331 and 332, the lower mobility of positive charge carriers restricts the saturation currents of the P-channel transistors 151 and 152 so that transistor 331 or 332 can pull down the voltage on a storage node N2 or N1. For a search, N-channel transistors 331, 332, 112, and 111 have the same dimensions. However, the biasing of bit lines 161 and 162 and word/match line 370 and the search pulse width (i.e., the time during which bit line 161 or 162 is high) are such that the current from the word line is insufficient to flip the bi-stable storage and change the stored value. The dimensions given are of course only one possible configuration, and many other alternative configurations having transistors of different sizes are possible. Also, the P-channel transistors 151 and 152 can be thin-film P-channel transistors. Further, an all-NMOS variation of CAM cell 300 can replace P-channel pull-up transistors 151 and 152 with high-resistance poly pull-up resistors or NMOS depletion load devices for applications in which higher standby current can be tolerated.

Table 2 shows selected voltages in CAM cell 300 and the conductivity states of transistors 331 and 332 during a search with the presumed storage convention.

TABLE 2

CAM Cell Voltages during a Search

| Stored Bit | N1 | N2 | Search Bit | BL 162 | BL 161 | Tms 332 | Tms 331 | Result |
|---|---|---|---|---|---|---|---|---|
| 0 | 0 | Vcc | 0 | 0 | Vcc | NC | NC | Match |
| 0 | 0 | Vcc | 1 | Vcc | 0 | C | NC | No Match |
| 1 | Vcc | 0 | 0 | 0 | Vcc | NC | C | No Match |
| 1 | Vcc | 0 | 1 | Vcc | 0 | NC | NC | Match |

Table 2 lists the conductivity states of transistors 331 and 332 as NC to indicate no detectable current and C to indicate detectable current. During a search, a transistor 331 or 332 does not conduct if its gate (i.e., bit line 161 or 162) is grounded, or the connected node N2 or N1 is at supply voltage Vcc (the same voltage as word/match line 370). A "match" results if neither transistor 331 nor 332 causes detectable current. "No match" results if either transistor conducts detectable current.

As Tables 1 and 2 show, the complementary signals biasing bit lines 161 and 162 for a write operation have a polarity that is opposite the polarity of the complementary signals biasing bit lines 161 and 162 for a search operation. In particular, if an input or search bit is a zero, a write operation biases bit lines 161 and 162 to voltages 0 and Vcc, respectively, but a search operation biases bit lines 161 and 162 to voltages Vcc and 0, respectively. Similarly, if an input or search bit is a one, a write operation biases bit lines 161 and 162 to voltages Vcc and 0, respectively, but a search operation biases bit lines 161 and 162 to voltages 0 and Vcc, respectively. For opposite storage convention, the bit line voltages for both write and search operations would be reversed from those described above.

FIG. 4A illustrates a ternary CAM cell 400 in accordance with an embodiment of the invention. Ternary CAM cell 400 includes transistors 111, 112, 151, 152, 331, and 332 which connected to each other and to bit lines 161 and 162 as described above in regard to FIG. 3. However, in CAM cell 400, transistors 331 and 332 connect to a word/match line 470 through an N-channel transistor 440. Alternatively, two separate transistors (not shown) can replace transistor 440 and connect respective transistor 331 and 332 to word/match line 470.

Additionally, a mask element 210 has a node N2' connected to the gate of transistors 440 and controls whether transistor 440 is conductive. Mask element 210 has two states. One state activates local masking in CAM cell 400. The other state disables local masking. In CAM cell 400, mask element 210 is a six-transistor SRAM cell which includes P-channel pull-up transistors 251 and 252, N-channel pull-down transistors 211 and 212, and N-channel pass transistors 221 and 222. A node N1' between transistors 251 and 211 connects to the gates of transistors 252 and 212. Node N2' is between transistors 252 and 212 and connects to the gates of transistors 251 and 211. Pass transistors 221 and 222 connect respective nodes N1' and N2' to respective bit lines 161 and 162. A local mask word line 285 for writing to and reading from mask element 210 connects to the gates of pass transistors 221 and 222.

When the state of mask element 210 indicates no local masking of CAM cell 200, a node N2' is at supply voltage Vcc to turn on transistor 440. Thus, transistors 331 and 332 when turned on electrically connect respective nodes N2 and N1 to word/match line 470, and CAM cell 400 operates in the same manner as described above for CAM cell 300 of FIG. 3. The addition of transistor 440 in series with transistors 331 and 332 does not have a significant effect on the performance of the CAM cell.

When the state of mask element 210 indicates local masking of the bit stored in CAM cell 400, node N2' is grounded. Thus, transistor 440 is off, and CAM cell 400 is unable to pull down word/match line 470 during a search. Accordingly, when the state of mask element 210 indicates local masking of CAM cell 400, CAM cell 400 is in the "don't care" state and never indicates that the stored bit fails to match an input bit. Further, the stored bit in CAM cell 400 cannot be changed when the state of memory element 210 indicates local masking because transistor 440 is off does not permit current between word/mask line 470 and nodes N1 and N2. Writing to CAM cell 400 thus requires first changing the state of masking element 210 to the "no masking" state.

A masking operation writes to mask element 210 to turn on or off local masking. To write to mask element 210, local mask word line 285 is raised to near supply voltage Vcc, and complementary signals on bit lines 161 and 162 indicate the desired state of mask element 210. Pass transistors 221 and 222 pass the high and low voltage from bit lines 161 and 162 to nodes N1' and N2' to pull nodes N1' and N2' to the voltage levels associated with the state being written. To turn on local masking, bit line 161 is biased high (at supply voltage Vcc), and bit line 162 is biased low (grounded). To turn off local masking, bit line 161 is biased low, and bit line 162 is biased high. Writing to mask element 210 does not disturb the stored value or voltage states of nodes N1 and N2 because even if transistor 440 is conductive, current from the high voltage on word/match line 470 through transistor 331 or 332 and the time during which bit line 161 or 162 is at the "high' state are insufficient to change the store value. The biasing for word/match line 470 is near supply voltage Vcc, the same as during a search.

Writing a bit to ternary CAM cell 400 is the same as writing to CAM cell 300 described above, except that mask element 210 must be in a state indicating no masking. Accordingly, a write operation may involve a masking operation that places mask element 210 in the "no masking" state followed by a write operation that writes the stored bit in CAM cell 400. Another masking operation can set mask element 210 in the state indicating local mask if masking of the newly stored bit is desired.

FIG. 4B shows a ternary CAM cell 400B which permits writing even when mask element 210 indicates masking and permits temporary suspension of local masking. CAM cell 400B includes the elements of CAM cell 400 connected as described above in regard to FIG. 4A, but CAM cell 400B further includes a transistor 442 connected in parallel with transistor 440 between word/match line 470 and transistors 331 and 332. The gate of transistor 442 receives a signal WRITE or a signal SUSMSK that is asserted during a write operation. Signal WRITE can be generated on a global basis for all CAM cells 400B in an array or for a selected row of CAM cells 400B when the gate of transistor 442 is connected to a write word line (not shown). When signal WRITE is asserted high, transistor 442 turns on, and a low voltage on word/match line 470 transfers through transistor 442 and transistor 331 or 332 to node N1 or N2 for a write operation, regardless of the state of mask element 210. Accordingly, the state of mask element 210 does not need to be changed for a write operation performed on CAM cell 400B.

Another feature of CAM cell 400B is the ability to temporarily turn off local masking without changing the state of mask element 210. Signal SUSMSK being asserted (high) during a search operation turns on transistor 442 and connects transistors 331 and 332 to match/word line 370. Accordingly when signal SUSMSK is asserted, CAM cell 400B operates in the same manner as binary CAM cell 300 of FIG. 3. With transistor 442 off (signal SUSMSK deasserted), CAM cell 400B operates in the same manner as ternary CAM cell 400. Signal SUSMSK can be generated on a global basis for an entire array or on a row-by-row basis to suspend masking only in one or more selected rows.

A concern for ternary CAM cells 400 and 400B is the power-up state of mask element 210. Typically, with a bi-stable storage element such as mask element 210, the power-up state of the storage element is undetermined. A mask operation can set mask element 210 in a known state. Alternatively, transistors 211, 212, 251, and 252 can be given different dimensions to create a preferred power-up state to which mask element 210 settles. For example, if cell 400 or 400B needs to be in the "no masking" state when power up occurs, node N2' needs to go to "high", and node N1' needs to go to "low". This can be achieved by skewing the dimensions of cross-coupled transistors 211, 212, 251, and 252 so that the ratio of the channel width to channel length for transistor 252 is greater than the ratio of the channel width to channel length for transistor 251, and the ratio of the channel width to channel length for transistor 211 is greater than the ratio of the channel width to channel length for transistor 212.

FIG. 4C shows a ternary CAM cell 400C having a mask element 410 that powers up in a known state. CAM cell 400C contains the same elements as CAM cell 400 of FIG. 4A, but CAM cell 400C additionally includes an N-channel transistor 411 coupled to pull-down node N1' in mask element 410, during start up. In particular, transistor 411 connects between node N1' and ground and has a gate which receives a power-on-reset signal POR. When a circuit containing CAM cell 400C is turned on or reset, signal POR is briefly asserted causing transistor 411 to pull node N1' down to the low voltage state so that CAM cell 400C is in the "no masking" state. Other connections of transistor 411 (e.g., to node N1' or N2' and to ground or supply voltage Vcc) can be used to ensure either the "no masking" state or the "masking" state. Additionally, mask element 410 of CAM cell 400C can replace mask element 210 in CAM cell 400B of FIG. 4B if both a known power up state and the ability to ignore local masking are required.

Another advantage of having pull-down transistor 411 or another device in mask element 410 is ability to easily set mask element 410 in the "no masking" state during operation of CAM cell 400C. When a signal UNMSK is asserted (high), transistor 411 pulls down node N1' thereby setting mask element 410 in the "no masking" state. Signal UNMSK can be generated on a global basis to remove all local masking in an array of CAM cells 400C or on a row-by-row basis to turn off local masking only in one or more selected rows of a CAM array.

FIG. 5 shows a CAM 500 including an array 510 of the CAM cells 300 of FIG. 3. Array 510 is simplified for ease of illustration. An actual CAM array includes hundreds or thousands of rows with hundreds of CAM cells 300 per row. CAM 500 includes a word/match line control circuit 520 coupled to word/match lines 370, a bit line control circuit 530 coupled to bit lines 161 and 162, sense amplifiers 540 coupled to word/match lines 370, and a priority encoder 550 coupled to sense amplifiers 540. Word/line control circuit 520 includes selection and bias circuits. The selection circuit is an address decoder that selects a word/match line 370 that an address signal ADRIN identifies. The bias circuits bias selected and unselected word/match lines 370 for write and search operations. Bit line control circuit 530 biases pairs of bit lines 161 and 162 according to associated bits of an input signal DATA_IN. Sense amplifiers 540 sense word/match lines 370 during a search and generate match signals to indicate which of the rows of array 510 store CAM words matching an input value. Priority encoder 550 converts the match signals into an output signal ADROUT corresponding to any CAM words which match the input signal.

For a writing of a word to array 510, word/match line control circuit 520 receives an address signal ADRIN that identifies a word/match line and its associated row of CAM cells 300 in array 510 for the write, and bit line control circuit 530 receives a data signal DATA_IN indicating a word to be written to the selected row of CAM cells 300. Control circuit 520 grounds the selected word/match line 370 and biases the unselected word/match lines 370 at supply voltage Vcc. Bit line control circuit 530 applies to each pair of bit lines 161 and 162, complementary signals representing the bit from signal DATA_IN that is being written in a CAM cell 300 that is connected to the bit lines 161 and 162 and in the selected row. Since the unselected word/match lines 370 are at supply voltage Vcc and the selected word/match line 370 is grounded, the signals on bit lines 161 and 162 only change the states of CAM cells 300 in the selected row.

For a search, signal DATA_IN to bit line control circuit 530 indicates a search value for simultaneous comparison to the CAM words stored in array 500. Word/match line control circuit 520 charges all of the word/match lines 370 to supply voltage Vcc, and bit line control circuit 530 applies to each pair of bit lines 161 and 162, complementary signals representing the associated bit from signal DATA_IN. The complementary signals that control circuit 530 uses to represent a bit value during the search are opposite to the complementary signals that control circuit 530 uses to represent the bit value during a write operation. Each sense amplifier 540 senses whether CAM cells 300 discharge the word/match line 370 associated with the sense amplifier, and "match" signals from the sense amplifiers 540 to priority encoder 550 indicate whether the associated CAM words match the search value. Priority encoder 550 interprets the match signals and generates an output signal (or address) ADROUT corresponding to a CAM word that matches the search value. For routing applications of CAM 500, signal ADROUT can be value selected from a look-up table included in priority encoder 550. When multiple CAM words match the search value, priority encoder 550 outputs signal ADROUT corresponding to the CAM words according to a priority order for the CAM words. The priority order, for example, may be based on the row addresses for the CAM words, the order in which CAM words are physically mapped into CAM 500, or which CAM word priority encoder 550 was last identified as a match. Priority encoders such as priority encoder 550 are well known for CAMs.

FIG. 6 is a block diagram of a CAM 600 including an array 610 of ternary CAM cells 400 of FIG. 4A. Array 610 is simplified for illustration but would normally contain hundreds or thousands of rows and columns of CAM cells 400. Coupled to array 610 are a word/match line control circuit 520, a bit-by-bit local masking control circuit 620, a bit line control circuit 530, and sense amplifiers 540. Priority encoder 550 connects to and receives match signals from sense amplifiers 540 as described above in regard to FIG. 5. CAM 600 differs from CAM 500 in that array 610 and ternary CAM cells 400 have word lines 285 for masking operations and control circuit 620 controls masking word lines for write, search, and bit-by-bit local masking operations.

For a masking operation, an address signal MA identifies a selected row of array 610 for which the masking is to be changed, and input signal DATA_IN indicates which CAM cells 400 (or CAM bits) in the selected row, are to have masking enabled or disabled. For the masking operation, masking control circuit 620 biases the selected mask word line 285 to supply voltage Vcc and grounds all unselected mask word lines 285, and word/match line control circuit 520 biases all word/match lines 470 to supply voltage Vcc. Bit line control circuit 530 biases each pair of bit lines 161 and 162 with complementary signals indicating the state desired for local masking in a CAM cell 400 that is in the selected row and coupled to the bit lines.

For a write operation to a CAM word, address signal ADRIN selects a row for the write operation, and signal DATA_IN indicates the word to be written. For the write operation to work, none of the CAM cells 400 corresponding to the select CAM can have local masking. An optional register (not shown), which includes one bit of storage for each CAM word in array 610, can be set to indicate which CAM words or rows include at least one cell with a locally masked bit. If there is no local masking in a particular row, a write operation can proceed without an initial masking operation. Otherwise, CAM 600 performs a masking operation to remove any masking of CAM cells 400 in the selected row. After the unmasking, control circuit 520 grounds the selected word/match line 470 and biases the unselected word/match lines 470 to near supply voltage Vcc, and mask control circuit 620 grounds all mask word lines 285 so that writing of a CAM word does not affect the mask elements 210. Bit line control circuit 530 then biases each pair of bit lines 161 and 162 with complementary signals indicating a bit to be written in a CAM cell 400 that is in the selected row and coupled to the bit lines.

For a search, control circuit 620 grounds all mask word lines 285, and control circuit 520 charges all word/match lines 470 to near supply voltage Vcc. Next, bit line control circuit 530 biases bit lines 161 and 162 according to the input data that signal DATA_IN represents. Sense amplifiers 540 generate match signals according to which of row(s) of array 610 include CAM cell(s) 400 that detectably pull down their associated match/word line(s) 470, and priority encoder 550 generates output signal ADROUT from the match signal(s) as described above.

FIG. 7 shows a CAM 700 in accordance to another embodiment of the invention. CAM 700 includes an array 710 of ternary CAM cells 715. Each ternary CAM cell 715 differs from the ternary CAM cell 400 of FIG. 4A in that pass transistors 221 and 222 for the mask element connect to bit lines 761 and 762 which are separate from the bit lines 161 and 162 used for write and search operations. Accordingly, write and search operation use a set of bit lines 161 and 162, and local masking operations use a different set of bit lines 761 and 762. In CAM 700, bit line control circuit 530 controls bit lines 161 and 162 for write and search operations, and a local masking bit line control circuit 730 controls mask bit lines 761 and 762 for mask operations. This provides greater flexibility in design of control circuits 520 and 620 since word/line control circuit 520 does not need to bias word/match lines 470 during a masking operation, and mask word line control circuit 620 does not is need to bias mask word lines 285 for write or search operations. Further, higher performance can be achieved because CAM 700 can conduct a masking operation simultaneously with a write operation or a search.

Although much of the above disclosure concentrated CAM cell architectures that reduce transistor count using strategically placed transistors with control terminals coupled to bit lines. Other aspects of the invention can be employed in CAM cells having more traditional storage elements. For example, the ability to temporarily turn off local masking is also desirable in conventional ternary CAM cells such as CAM cell 200 of FIG. 2. FIG. 8 illustrates a memory cell 800 having a storage element including transistors 111, 112, 121, 122, 131, 132, 141, 142, 151, and 152 as described above in regard to FIG. 2, except that transistors 141 and 142 connect to match line 170 through N-channel transistors 442 and 840. Mask element 410 couples to the gate of transistor 840 and controls whether or not transistor 840 conducts. In particular, when node N2' is "high", transistor 840 conducts, and CAM cell 800 is unmasked. When node N2' is low, transistor 840 does not conduct, and CAM cell 800 is locally masked (i.e., in the "don't care state"). However, even when the state of mask element masks CAM cell 800, transistor 442 temporarily suspends or supersedes the local masking when signal WRITE causes transistor 442 to conduct.

CAM cell 800 also includes the feature of using mask element 410 which includes circuitry (transistor 411) for ensuring that mask element 410 powers up with a known masking state. Operation of mask element 410 is described above in regard to FIG. 4C.

Although the invention has been described with reference to particular embodiments, the description is only an example of the invention's application and should not be taken as a limitation. In particular, even though much of preceding discussion specified specific transistor types, alternative embodiments of are not limited to the specific types disclosed. Various other adaptations and combinations of features of the embodiments disclosed are within the scope of the invention as defined by the following claims.

We claim:

1. A CAM cell comprising:
   a storage element having a first node and a second node, wherein voltages on the first and second nodes indicate a value stored in the storage element;
   a first transistor coupled to the first node, wherein the first transistor acts as both a pass transistor for write operations and a search transistor for search operations; and
   a second transistor coupled to the second node, wherein the second transistor acts as both a pass transistor for write operations and a search transistor for search operations.

2. The CAM cell of claim 1, where in the storage element comprises:
   a first pull-up device and a first pull-down transistor coupled in series, wherein the first node is between the first pull-up device and the first pull-down transistor, and the first pull-down transistor has a control terminal coupled to the second node; and
   a second pull-up device and a second pull-down transistor coupled in series, wherein the second node is between the second pull-up device and the second pull-down transistor, and the second pull-down transistor has a control terminal coupled to the first node.

3. A CAM cell comprising:
   a first pull-up device and a first pull-down transistor coupled in series, wherein a first node is between the first pull-up device and the first pull-down transistor, and the first pull-down transistor has a control terminal coupled to a second node;
   a second pull-up device and a second pull-down transistor coupled in series, wherein the second node is between the second pull-up device and the second pull-down transistor, and the second pull-down transistor has a control terminal coupled to the first node;
   a word/match line;
   a first bit line;
   a second bit line;
   a third transistor coupled between the second node and the word/match line, wherein a control terminal of the third transistor connects to the first bit line; and
   a fourth transistor coupled between the first node and the word/match line, wherein a control terminal of the fourth transistor connects to the second bit line.

4. The CAM cell of claim 3, wherein the first pull-down transistor, the second pull-down transistor, the third transistor, and the fourth transistor are N-channel transistors.

5. The CAM cell of claim 4, wherein:
   the first pull-up device is a P-channel transistor having a gate coupled to the second node; and
   the second pull-up device is a P-channel transistor having a gate coupled to the first node.

6. The CAM cell of claim 3, further comprising:
   a fifth transistor through which the third transistor connects to the word/match line; and
   a mask element coupled to a control terminal of the fifth transistor, the mask element having a first state that makes the fifth transistor non-conductive and a second state that makes the fifth transistor conductive.

7. The CAM cell of claim 6, wherein the mask element comprises an SRAM cell coupled to the first and second bit lines.

8. The CAM cell of claim 6, further comprising a third bit line and a fourth bit line, wherein the mask element comprises an SRAM cell coupled to the third and fourth bit lines.

9. The CAM cell of claim 6, further comprising a six transistor through which the third transistor connects to the word/match line, wherein the sixth transistor has a control terminal that receives a signal that is independent of the state of the mask element.

10. The CAM cell of claim 3, wherein:
    the third transistor when in a conductive state, has a current capacity greater than that of the second pull-up device; and
    the fourth transistor when in a conductive state, has a current capacity greater than that of the first pull-up device.

11. The CAM cell of claim 10, wherein:
    when the second and third transistors in conductive states, the second transistor has a current capacity greater than that of the third transistor; and
    when the first and fourth transistors in conductive states, the first transistor has a current capacity greater than that of the fourth transistor.

12. The CAM cell of claim 3, wherein:
    when the second and third transistors in conductive states, the second transistor has a current capacity greater than that of the third transistor; and
    when the first and fourth transistors in conductive states, the first transistor has a current capacity greater than that of the fourth transistor.

13. A content addressable memory comprising:
    an array that includes bit lines, word/match lines, and CAM cells, wherein each CAM cell comprises:
       a first pull-up device and a first pull-down transistor coupled in series, wherein a first node is between the first pull-up device and the first pull-down transistor, and the first pull-down transistor has a control terminal coupled to a second node;
       a second pull-up device and a second pull-down transistor coupled in series, wherein the second node is between the second pull-up device and the second pull-down transistor, and the second pull-down transistor has a control terminal coupled to the first node;
       a third transistor coupled between the second node and a word/match line corresponding to a row of the array that includes the CAM cell, wherein a control terminal of the third transistor connects to a first bit line that corresponds to a column of the array that includes the CAM cell; and a fourth transistor coupled between the second node and the word/match line that corresponds to the row including the CAM cell, wherein a control terminal of the third transistor connects to a second bit line that corresponds to the column including the CAM cell.

14. The memory of claims 13, further comprising:
sense amplifier blocks with each sense amplifier block being coupled to sense the state of an associated word/match line of the array during a search; and
an encoder coupled to receive sense signals from the sense amplifier blocks, wherein the encoder generates an output signal identifying a row of the array storing a word that matches an input value during the search.

15. The memory of claim 14, further comprising a control circuit coupled to the word/match line, wherein:
during a write operation, the control circuit receives an input address signal identifying a selected word/match line and in response, grounds the selected word/match line while biasing unselected word/match lines to a supply voltage; and
during a search, the word/match lines are charged for sensing.

16. The memory of claim 15, wherein for sensing charges the word/match lines to the supply voltage.

17. The memory of claim 13, further comprising a control circuit coupled to the word/match lines, wherein:
during a write operation, the control circuit receives an input address signal identifying a selected word/match line and in response, grounds the selected word/match line while biasing unselected word/match lines to a supply voltage; and
during a search, the word/match lines are charge for sensing.

18. The memory of claim 17, further comprising a second control circuit coupled to the bit lines, wherein:
during the write operation, the second control circuit receives an input data signal indicating a word to be written in a row of the array corresponding to the selected word/match line, and for each column of the array, the second control circuit applies complementary signals to the first and second bit lines that are associated with the column, the complementary signals indicating a bit from the data signal for writing in a CAM cell that connects to the first and second bit lines and to the selected word/match line; and
during a search, the input data signal to the second control circuit indicates a search value, and for each column of the array, the second control circuit applies complementary signals to the first and second bit lines that are associated with the column, the complementary signals indicating a bit from the data signal for comparisons with CAM cells in the column.

19. The memory of claim 13, wherein:
the array further comprises masking word lines; and
each CAM cell further comprises:
a fifth transistor through which the third transistor connects to the word/match line associated with the row containing the CAM cell; and
a mask element coupled to a control terminal of the fifth transistor, the mask element having a first state that makes the fifth transistor non-conductive and a second state that makes the fifth transistor conductive.

20. The memory of claim 19, wherein the mask element comprises an SRAM cell coupled to the first and second bit lines.

21. The memory of claim 19, wherein:
for each column of CAM cells in the array the bit lines in the array further comprise a third bit line and a fourth bit line associated with the column; and
in each CAM cell, the mask element in the CAM cell comprises an SRAM cell coupled to the third and fourth bit lines that are associated with the column containing the CAM cell.

22. The memory of claim 19, further comprising a control circuit coupled to the word/match lines and the masking word lines, wherein:
during a write operation, the control circuit receives an input address signal identifying a selected word/match line and in response, grounds the selected word/match line and the masking word lines while biasing unselected word/match lines to a supply voltage;
during a masking operation which changes the states of the mask elements, the input address signal to the control circuit identifies a selected masking word line and in response, the control circuit biases the word/match lines and the selected masking word line to the supply voltage and grounds unselected masking word lines; and
during a search, the word/match lines are charge for sensing and the masking word lines are grounded.

23. The memory of claim 22, further comprising a second control circuit coupled to the bit lines, wherein during write operations, masking operations, and searches, the second control circuit receives an input data signal, and for each column of the array, the second control circuit applies complementary signals to the first and second bit lines that are associated with the column, the complementary signals indicating a bit that is associated with the column and from the data signal.

24. The memory of claim 22, wherein before grounding the selected word/match line each write operation includes a masking operation which places the mask elements in the CAM cells associated with the selected word/match line, in second state.

25. A CAM cell comprising:
a storage element;
a match line;
a first transistor through which the storage element connects to the match line;
a mask element coupled to a control terminal of the first transistor, the mask element having a first state that makes the first transistor non-conductive and a second state that makes the first transistor conductive; and
a second transistor through which the storage element connects to the match line, wherein the second transistor has a control terminal that receives a signal that is independent of the state of the mask element.

26. The CAM cell of claim 25, wherein:
during a search operation using local masking as selected by the state of the mask element, the signal to the control terminal of the second transistor turns off the second transistor; and
during a search operation that ignores the local masking as selected by the state of the mask element, the signal to the control terminal of the second transistor turns on the second transistor.

27. A CAM cell comprising:
a storage element;
a match line;
a first transistor through which the storage element connects to the match line; and a mask element coupled to a control terminal of the first transistor, the mask element having a first state that makes the first transistor non-conductive and a second state that makes the first transistor conductive, the mask element comprising:

a bi-stable element having a first node and a second node, wherein complementary voltages on the first and second nodes indicate whether the mask element is in the first or second state; and a second transistor coupled between the first node and fixed voltage, wherein the second transistor is turned on to force the mask element into a known state.

28. The CAM cell of claim 27, further comprising circuitry that applies a signal to the control gate of the second transistor to turn on the second transistor during a power up process.

29. The CAM cell of claim 28, wherein the circuitry applies the signal to the control gate of the second transistor to turn on the second transistor during operation of CAM cells and thereby unmask the CAM.

30. The CAM cell of claim 27, further comprising circuitry that applies a signal to the control gate of the second transistor to turn on the second transistor during operation of CAM cells and thereby unmask the CAM.

31. The CAM cell of claim 27 further comprising a third transistor through which the storage element connects to the match line, wherein the third transistor has a control terminal that receives a signal that is independent of the state of the mask element.

32. A method for operating a content addressable memory that includes an array of CAM cells with each CAM cell including a pair of transistors having control terminals coupled to a corresponding pair of bit lines, the pair of transistors being between a corresponding word/match line and nodes in the CAM cell, the method comprising:

applying complementary signals to each pair of bit lines in the array, each pair of bit lines carrying complementary signals identifying a bit associated with the pair of bit lines;

grounding a selected word/match line, the selected word/match line, wherein for each CAM cell connected to the selected word/match line, grounding of a node in the CAM cell through one of the pair of transistors controls states of the nodes to write a bit in the CAM cell; and applying a voltage to word/match lines other than the selected word/match line, wherein the combination of the complementary signals on the bit lines and the word/match lines at the voltage does not change states of nodes in the CAM cells.

33. The method of claim 32, further comprising performing a search that includes:

charging the word/match lines to the voltage;

applying complementary signals to each pair of bit lines in the array, each pair of bit lines carrying complementary signals identifying a bit associated with the pair of bit lines; and sensing whether match lines remain charged when applying the complementary signals.

34. The method of claim 32, further comprising grounding masking word lines in the array to prevent the complementary signals on the pairs of bit lines from changing the states of mask elements that are connected to the bit line, each mask element controlling local masking of the CAM cell containing the mask element.

35. The method of claim 34, further comprising performing a masking operation that includes:

applying the voltage to a selected masking word line and all of the word/mask lines;

grounding masking word lines other than the selected masking word line; and applying complementary signals to each pair of bit lines in the array, each pair of bit lines having applied complementary signals identifying a desired state for the mask element that is in a CAM cell coupled to the selected masking word line.

* * * * *